United States Patent [19]
Okunuki et al.

[11] Patent Number: 5,233,196
[45] Date of Patent: Aug. 3, 1993

[54] ELECTRON BEAM APPARATUS AND METHOD FOR DRIVING THE SAME

[75] Inventors: Masahiko Okunuki, Tokyo; Haruhito Ono, Minami-ashigara, both of Japan

[73] Assignee: Canon Kabushiki Kaisha, Tokyo, Japan

[21] Appl. No.: 764,772

[22] Filed: Sep. 24, 1991

[30] Foreign Application Priority Data

Sep. 25, 1990 [JP] Japan .................................. 2-251790
Sep. 19, 1991 [JP] Japan .................................. 3-268356

[51] Int. Cl.⁵ ...................... H01J 37/30; H01J 37/147
[52] U.S. Cl. .................................. 250/398; 250/396 R
[58] Field of Search ........................ 250/396 R, 398; 313/363.1

[56] References Cited

U.S. PATENT DOCUMENTS

| | | | |
|---|---|---|---|
| 3,581,151 | 5/1971 | Boyle et al. | 357/52 |
| 4,506,284 | 3/1985 | Shannon | 357/52 |
| 4,516,146 | 5/1985 | Shannon et al. | 357/52 |
| 4,833,507 | 5/1989 | Shimizu et al. | 357/52 |
| 4,891,552 | 1/1990 | Moriyama | 313/432 |
| 5,059,804 | 10/1991 | Fink et al. | 250/396 R |
| 5,155,412 | 10/1992 | Chang et al. | 250/396 R |

*Primary Examiner*—Bruce C. Anderson
*Attorney, Agent, or Firm*—Fitzpatrick, Cella, Harper & Scinto

[57] ABSTRACT

An electron beam apparatus for applying an electron beam from an electron source onto a target plane is characterized by comprising one sheet of electrode disposed between said electron source for emitting the electron beam in parallel or substantially parallel and a target arrangement position, and a power source for supplying a desired voltage to said electrode.

19 Claims, 9 Drawing Sheets

FIG. I   PRIOR ART

ELECTRON BEAM APPARATUS AND METHOD FOR DRIVING THE SAME

BACKGROUND OF THE INVENTION

1. Field of the Invention

The present invention relates to an electron beam apparatus and its driving method, and more particularly to an electron beam apparatus and its driving method for applying the electron beam onto a target plane with the action of an electrostatic lens of an electrode having a feature of accelerating the electron beam.

2. Related Background Art

Along with the miniaturization of semiconductor devices, an electron beam exposure method has been used as means for forming minute patterns.

The accelerating voltage of the electron beam in the electron beam exposure method is increasingly important particularly in a range of several to several tens kV, due to the resolution and sensitivity of sensitive thin film (resist). With the progress of miniaturization of semiconductor devices, the process dimensions of 4 magabit DRAM and the following devices have become submicron, so that the diameter of the electron beam in an electron beam exposure apparatus is also required to be submicron.

On the other hand, the study of an electron source has been developed, whereby various types of elements have been proposed other than an electron emission element using a conventional hot cathode. For example, there have been proposed a type in which the reverse bias voltage is applied to a PN junction to cause the avalanche breakdown phenomenon so that electrons are emitted out of a element, as disclosed in Japanese Patent Application Laid-Open No. 54-111272 (corresponding to U.S. Pat. No. 4259678) and No. 56-15529 (corresponding to U.S. Pat. No. 4303930), a type in which the reverse bias voltage is applied to a Schottky barrier junction to cause the avalanche breakdown phenomenon so that electrons are emitted out of element, as described in Inst. Phys. Conf. Ser. No. 99, pp. 65 to 68, 1989, a type (MIM type) having a metal-insulator layer-metal configuration in which voltage is applied across two metal layers to cause the tunnel effect so that electrons passing through an insulator layer are emitted through a metal layer out of element, a surface conductive type (SCE type) in which voltage is applied to a highly resistive thin film in a direction orthogonal to the direction of film thickness so that electrons are emitted from a surface of the thin film out of element, a field effect type (FE type) in which the voltage is applied to a metal shaped to easily bring about the electric field concentration to develop locally an electric field of high density so that electrons are emitted from the metal out of element, a type in which a work function decreasing material layer is formed on a p-type semiconductive layer, and electrons are emitted by using the NEA (negative electron affinity) state whose vacuum level is at an energy level lower than the conduction band of P-type semiconductor, and other types.

Among these electron sources, four electron sources of the element in which the reverse bias voltage is applied to the PN junction to develop the avalanche breakdown phenomenon, the element in which the reverse bias voltage is applied to the Schottky barrier junction to cause the avalanche breakdown phenomenon, the MIM type element and the element using the NEA state have features that the electron beam obtained is superior in the parallelism, and they can be fabricated in minute area with the semiconductor process technique.

By the way, to meet the previously-mentioned requirement for the electron beam exposure apparatus, i.e., the requirement that the diameter of a beam spot on a target plane is submicron in a range of several to several tens kV of acceleration voltage, several stages of electromagnetic lenses as shown in FIG. 1 are used in a conventional apparatus.

An electron beam apparatus as shown in FIG. 1 is constituted such that the electron beam 111 emitted from an electron gun 101 is passed through electromagnetic lenses 102 having multiple stages for converging it to a desired spot diameter, a blanking electrode 103 for turning it on/off, and a deflection electrode 104 for deflecting it, before being applied on a target 110 placed on a table 108. In order to apply the electron beam 111 to a correct position of the target 110 placed on the table 108, it is constituted to measure the position with a laser interference meter 105 and move the target 110 to a desired position with a motor 107 based on the measurement. The target 110 is conveyed into or out of the electron beam apparatus by an automatic feeder 106. And to apply the electron beam precisely and correctly, they are disposed on an antivibration base 109 to prevent an adverse effect due to external vibrations.

However, there are following problems associated with the electron beam apparatus having several stages of electromagnetic lenses as above described.

(1) There are many components so that the apparatus is expensive.

(2) There are many components so that the apparatus including the antivibration base is heavy.

(3) There are many components so that the space volume occupied by the apparatus is large. Particularly, the apparatus is high (or long), and there are many racks storing control and power supply units.

(4) There are many components, therefore many adjusting portions, so that the adjustment for the performance of apparatus is complex and difficult.

(5) There are many components, thus many elements causing abnormality, so that the apparatus has a higher probability of failure and may lack in a sufficient reliability.

As electrons emitted from the electron gun usually used are divergent, it was required to use multiple stages of electromagnetic lenses to make the electrons a converged beam, particularly apply them onto the target in the order of submicron.

However, the finally converged electron beam is not obtained from all the electrons emitted from the electron gun, and was not sufficient from the viewpoint of the efficiency.

SUMMARY OF THE INVENTION

In view of the above-mentioned respects, it is an object of the present invention to provide an electron beam apparatus capable of converging the beam to the order of submicron in diameter on a target plane.

It is another object of the present invention to provide an electron beam apparatus which is simply constituted so as to reduce a cost of the apparatus, the weight of apparatus lighter the size of apparatus, the height, with fewer racks storing control and power supply units, allow a simple adjustment operation for the performance of apparatus with fewer adjustment portions, and have a higher reliability with fewer number of parts.

DETAILED DESCRIPTION OF THE PREFERRED EMBODIMENTS

Figure 1:
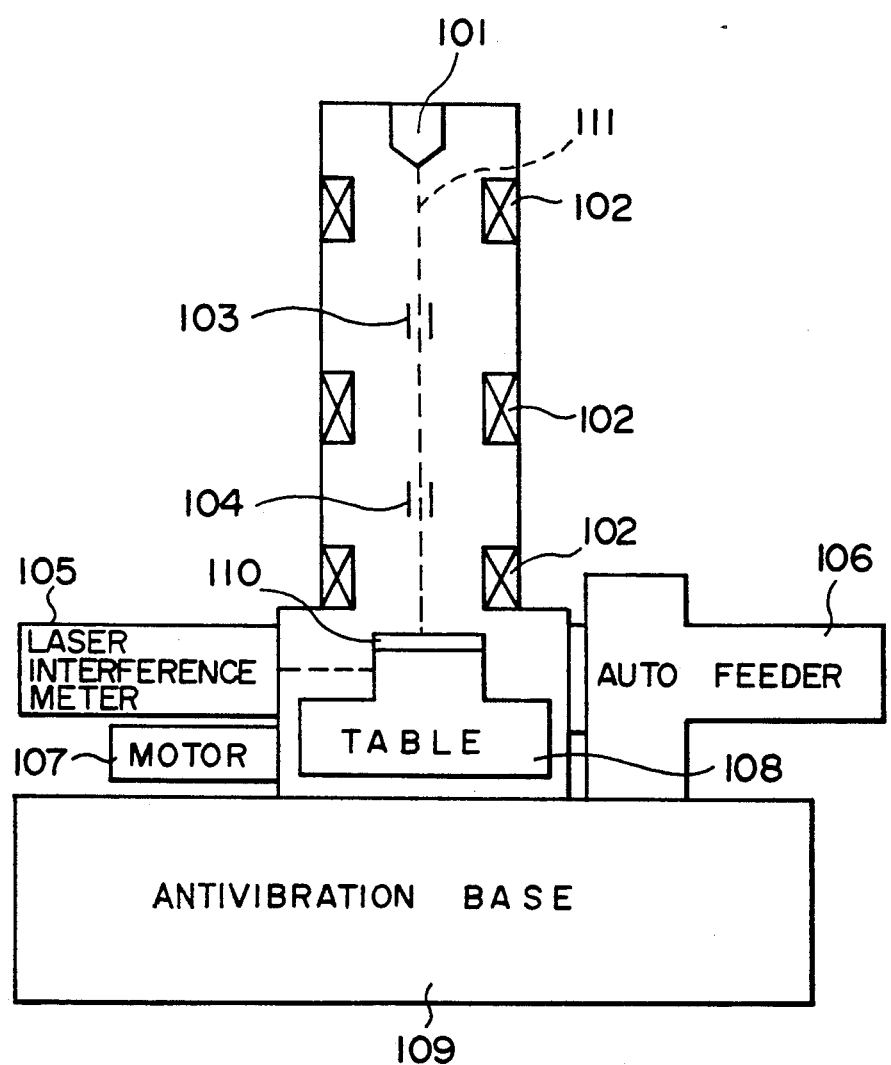
FIG. 1 is a schematic constitutional view showing a conventional electron beam apparatus.

An electron beam apparatus of the present invention which attains the previously-described objects is one in which an electron beam is applied from an electron source onto a target plane, with one sheet of electrode disposed between the electron source and a target arranged position and comprising a power source for supplying a desired voltage to the electrode.

Also, an electron beam apparatus of the present invention is one in which an electron beam is applied from an electron source onto a target plane, comprising a plurality of basic constitutions, each of which is composed of one sheet of electrode disposed between the electron source and a target arranged position, and a power source for supplying a desired voltage to the electrode.

That is, the electron beam apparatus of the present invention is one in which an electron beam is applied from an electron source onto a target plane, comprising an electrode disposed between the electron source such as a semiconductor electron source for emitting electrons in parallel or substantially parallel (or superior in the parallelism) and a target arranged position, and formed with an aperture for the passage of the electron beam emitted from the semiconductor electron source, and a power source for supplying a desired voltage to the electrode.

As the electron source for emitting the beam superior in the parallelism, there is no limitation on the emission principle, but preferable examples are the type in which the electron source emits electrons by applying a reverse bias voltage to the PN junction to cause the avalanche breakdown phenomenon, the type in which the electron source emits electrons by applying a reverse bias voltage to the Schottky barrier junction to cause the avalanche breakdown, the MIM type of electron source, and the type in which the electron source emits electrons by using the NA state.

Note that in the electron beam apparatus of the present invention, the target arranged position is preferably set so that the distance between the electron source and the electrode is in a range from 500 A° to 50 μm, and the distance between the electrode and the target plane is in a range from 500 μm to 100 mm.

Assuming that the distance from the electron source to the electrode is d [μm], the thickness of the electrode is t [μm], the distance from the electrode to the target plane is D [μm], the potential of the electrode with respect to the electron source is $V_M[V]$, the potential of the target plane with respect to the electron source is Va [V], it is desirable that in a state where the electron beam is applied onto the target plane, the inequality $$D/(d+t) < V_a/V_M$$

is satisfied.

Also, assuming that the distance from the electron source to the electrode is d [μm], the thickness of the electrode is t [μm]; the distance from the electrode to the target plane is D [μm], the potential of the electrode with respect to the electron source is VM [V], the potential of the target plane with respect to the electron source is Va [V], it is desirable that in a state where the electron beam is applied onto the target plane, the equation $$\{D/(d+t)\}(1+a) = V_a/V_M (0 < a < 1.0)$$

is satisfied.

Also, in the electron beam apparatus in which an electron beam is applied from an electron source onto a target plane, comprising a plurality of basic constitutions, each of which is composed of one sheet of electrode disposed between the electron source and a target arranged position, and a power source for supplying a desired voltage to the electrode, assuming that in each basic constitution, the distance from the electron source to the electrode is di [μm], the thickness of the electrode is ti [μm], the distance from the electrode source to the target plane is Di [μm] (i = 1, 2, ..., the number of basic constitutions), and the potential of the target plane with respect to the electron source is $V_a[V]$, it is desirable that the inequality
$$V_{Mi} < \{(di+ti)Di\}V_a$$

is satisfied for the potential $V_{Mi}$ of each electrode with respect to each electron source.

Also, in the electron beam apparatus in which an electron beam is applied from an electron source onto a target plane, comprising a plurality of basic constitutions, each of which is composed of one sheet of electrode disposed between the electron source and a target arranged position, and a power source for supplying a desired voltage to the electrode, assuming that in each basic constitution, the distance from the electron source to the electrode is di [μm], the thickness of the electrode is ti [μm], the distance from the electrode source to the target plane is Di [μm] (i = 1, 2, ... , the number of basic constitutions), and the potential of the target plane with respect to the electron source is $V_a$ V], it is desirable that in a state where the electron beam is applied to the target plane, each electrode potential $V_{Mi}$ with respect to each electron source can be determined by the equation $$V_{Mi} = V_a(di+ti)/Di \cdot (1+a) \ (0 < a \leq 1.0)$$

In the following, the electron beam apparatus of the present invention will be described in more detail.

The apparatus of the present invention has the electron beam from the electron source which is accelerated and finally converged to reach the target plane, with one sheet of electrode disposed between the electron source and the target arranged position.

The present invention is based on a discovery that by using an electron source superior in the parallelism of the beam and having a minute electron emission unit, which has been recently available, the electron beam can be converged to the order of submicron in diameter, with a single lens which is relatively inferior in the convergence effect, and can be directly applied to the electron beam exposure.

As the electron source superior in the parallelism of the beam for use in the present invention, the previously-cited electron sources can be preferably used, but particularly, it is desirable to use an electron source having a divergence angle of less than 15°, more preferably less than 10°. The electrons emitted from the electron source is subject to the lens action with one sheet of electrode disposed between the electron source and the target. Assuming that the intensity of electric field in the neighborhood of the electrode on the electron source side is Ee, and the intensity of electric field in the neighborhood of the electrode on the target side is Et, the equipotential surface in the neighborhood of an aperture portion of the electrode is convex on the side of the target so that the electron beam is divergent, if Ee>Et, while the equipotential surface in the neighborhood of the aperture portion of the electrode is convex on the side of the electron source so that the electron beam is convergent, if Ee<Et.

Using FIG. 2 which is a schematic constitutional view for explaining a schematic constitution of the electron beam apparatus of the present invention, one constitutional example of the electron beam apparatus of the present invention will be described.

Figure 2:
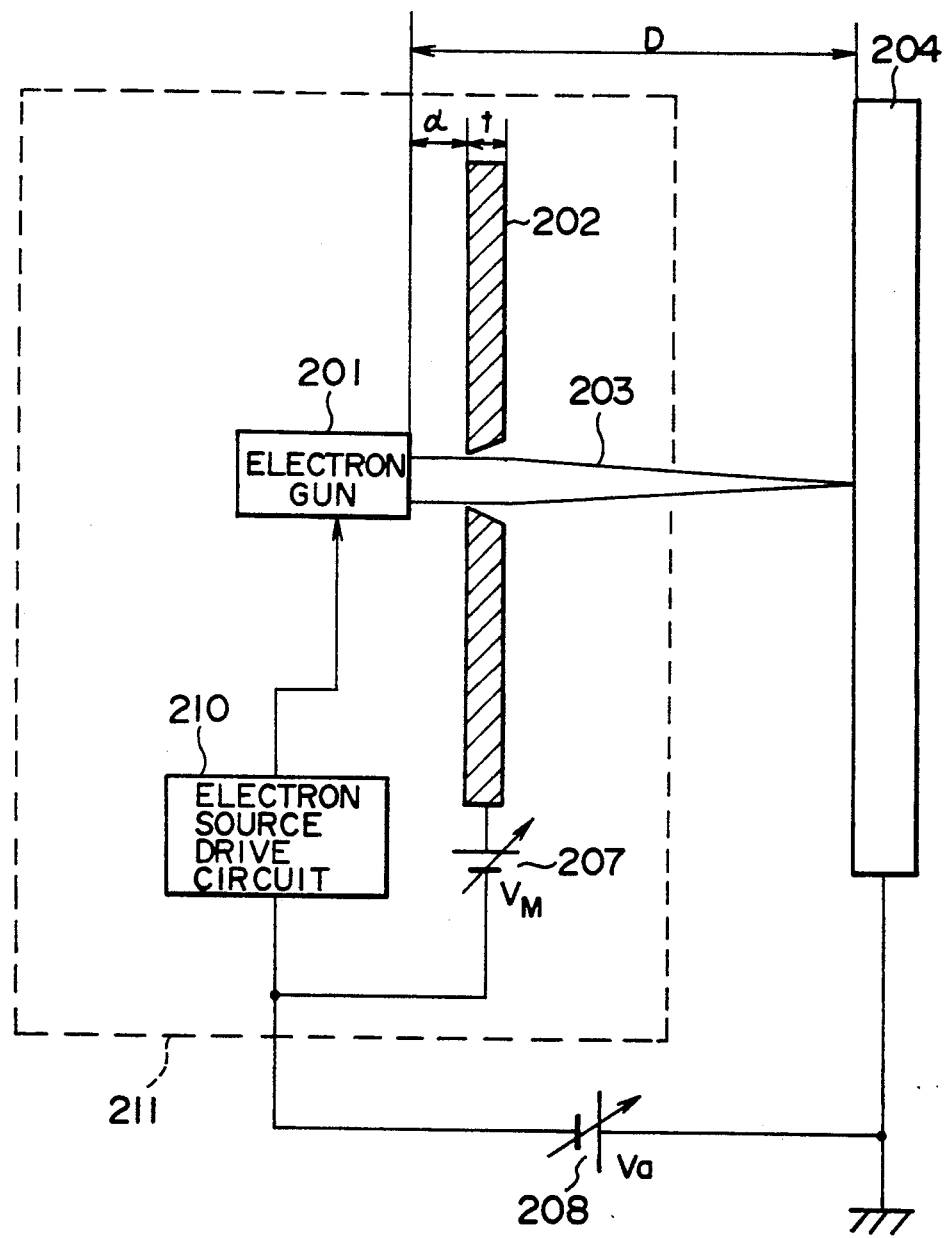
FIGS. 2 and 7 are schematic constitutional views showing an electron beam apparatus of the present invention, respectively.

In the electron beam apparatus as shown in FIG. 2, 201 is an electron source having electron generating means, 202 is an electrode to which the voltage for acceleration and convergence is applied, 203 is an electron beam, 204 is a target plane onto which the beam is converged, 207 is a power source for supplying the voltage for acceleration and convergence; 208 is a power source for supplying a final acceleration voltage, and 211 is a high voltage portion to which the final acceleration voltage is applied.

The high voltage portion 211 is composed of the electron source 201 and its driving circuit, and the electrode 202 to which the positive voltage relative to that circuit is applied by the power source 207. The high voltage portion 211 has a negative voltage relative to the target plane 204 at the ground level applied by the power source 208

With the above constitution, by selecting appropriately the final acceleration voltage applied by the power source 208 and the electrode voltage applied by the power source 207, it is possible to obtain a converged electron beam on the target plane 204.

In FIG. 2, assuming that the distance from the electron source to the electrode is d [μm], the thickness of the electrode is t [μm], the distance from the electron source to the target plane is D [μm], the potential of the electrode with respect to the electron source is $V_M$ [V], the potential of the target plane with respect to the electron source is $V_a$ V], it is possible to converge the electron beam to a desired beam spot efficiently, if the inequality $$D/(d+t) < V_a/V_M$$

is satisfied.

Figure 3:
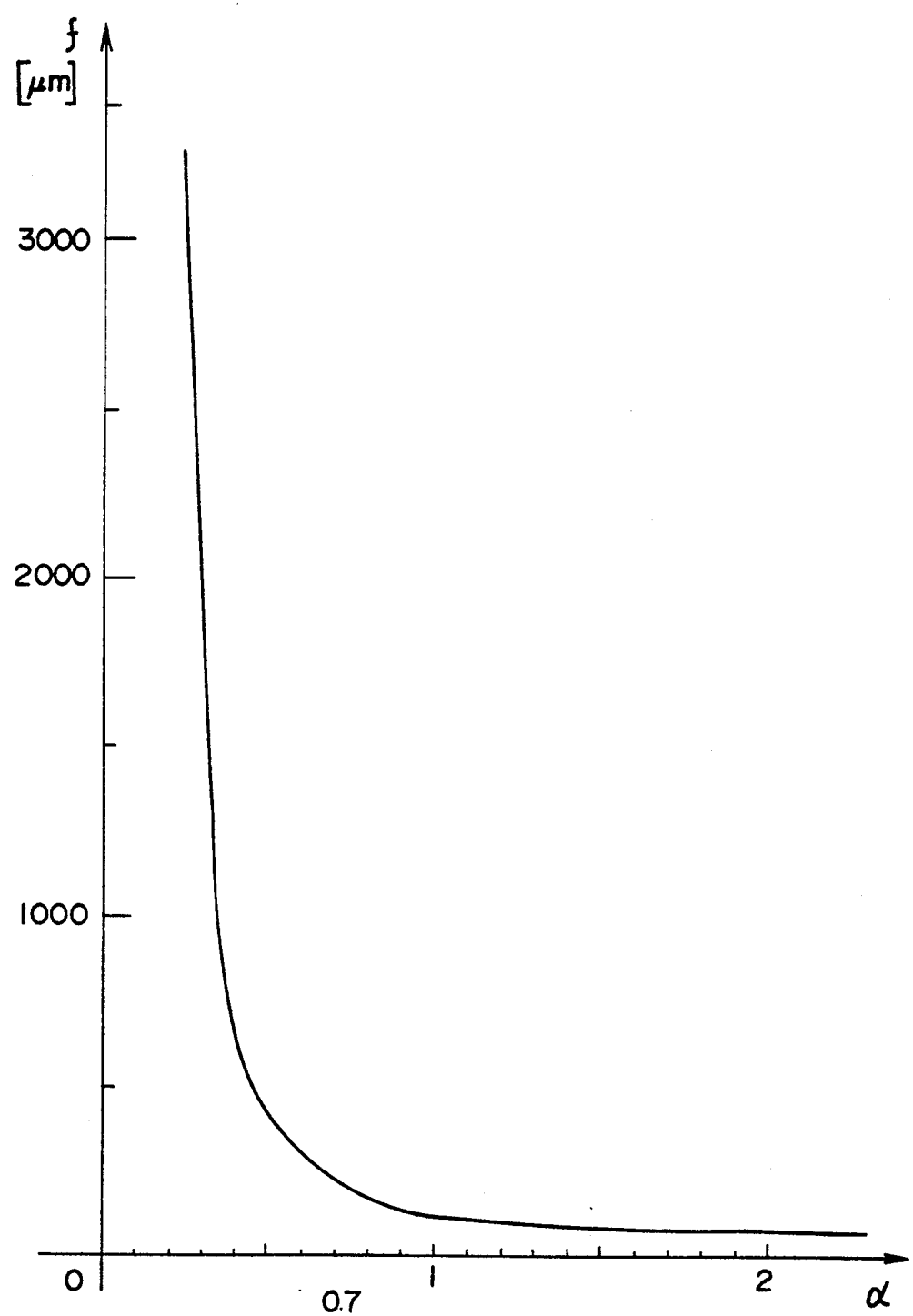
FIGS. 3, 4 and 5 are graphs showing the characteristics of the electron beam apparatus of the present invention, respectively.

Particularly, if $\{D/(D+t)\} \cdot (1+\alpha) = V_a/V_M (0 < \alpha < 1)$ in the above expression, it is possible to obtain a more effective beam spot on the target. Here, the reference will be made to FIG. 3. FIG. 3 shows the focal length f[μm] measure from the electron source, when the electrode voltage $V_M$ (V), and thus $\alpha$ is changed, where $d=5(\mu m)$, $t=0.5(\mu m)$, $D=3000(\mu m)$, $V_a=10000(V)$, and the diameter of electrode aperture=5(μm). From FIG. 3, it can be found that the focal length f and the electron source-target distance D can coincide in this system when $\alpha=0.26$.

As it will be seen from FIG. 3 that the focal length f is largely changed in a region where $\alpha$ is less than 1, approaching to the distance D, the range $0<\alpha<1$ is a preferable condition for obtaining the beam spot of a desired size efficiently. Also, in an example as shown in FIG. 3, the range $0<\alpha<0.7$ is a more preferable condition, and $0<\alpha<0.5$ is a still more preferable condition. Generally, the range of $\alpha$ has a tendency similar to the example as shown in FIG. 3. Then an optimal value of $\alpha$ can be changed by the thickness t of electrode, but is the same as above described.

Note that the relation between the distance d from the electron source to the electrode and the $d+t \leq 25$ μm, taking into consideration the electron beam apparatus fabricated in practice.

Furthermore, the relation between the diameter a of the electrode aperture and the above-mentioned distance d should be preferably $d/a \leq 3$.

In addition, it is generally preferable to have the relation Se<Sa where the area of electron emission face of the electron source is Se and the area of the electrode aperture is Sa. This is because if Se>Sa, all the electrons emitted can not be used, and the disturbance of electron flow may be likely to occur in the neighborhood of the aperture. When an insulating layer is interposed between the electron source and the electrode, it is desirable to determine the size of aperture in the insulating layer by considering the disturbance or unstableness of electron flow due to the charge-up of the insulating layer, and in ordinary cases, it is desirable to have a larger aperture than the area Se of the electron source.

If the electron beam not excellent in parallelism is converged with a single electrode of the present invention, the focal length is largely different for each flux of electron beams having different divergence angles, so that the diameter of electron beam is spread on the target plane, and it is difficult to obtain the electron beam directly applicable to the electron beam exposure.

Also, when the electron beam not excellent in parallelism is used, the intensity distribution of the beam on the target plane is not preferable. Specifically, the intensity distribution of the beam becomes broad, and particularly when a desired pattern is formed in the order of submicron, the pattern is badly cut and the forming ability of correct and minute pattern is decreased.

In the following, more specific examples of the present invention will be described.

EXAMPLE 1

An electron beam apparatus of this example was manufactured in accordance with a constitutional example of the electron beam apparatus as described in FIG. 2.

In this example, the distance d between the electron source 201 and the electrode 202 was 20 μm, the thickness t of the electrode 202 was 5 μm, the distance D between the electron source 1 and the target plane 204 was 1 mm, and the diameter of aperture of the electrode 202 was 10 μm ($D/(d+t)=40$ in this example).

Figure 4:
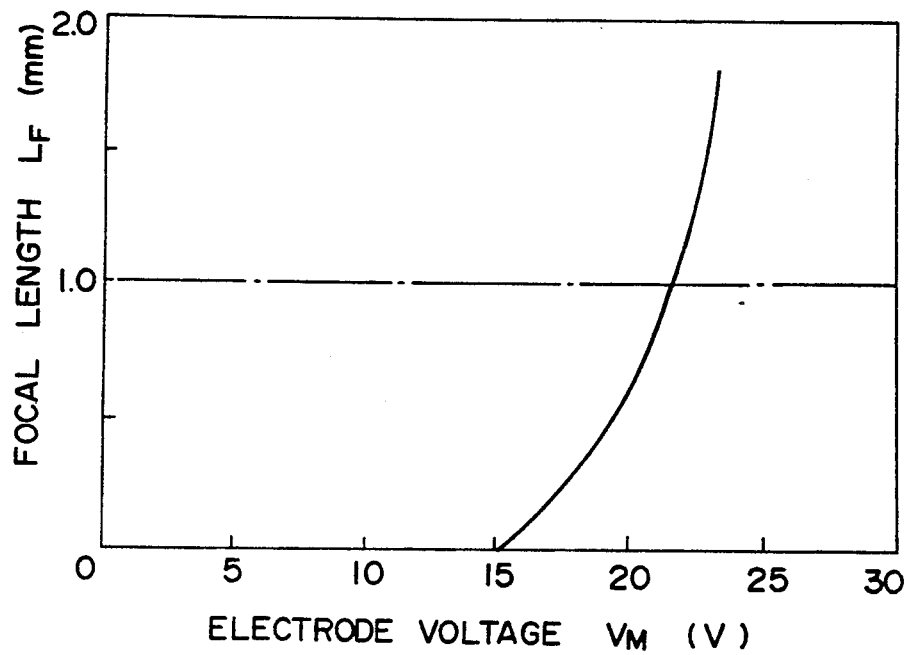
Figure 5:
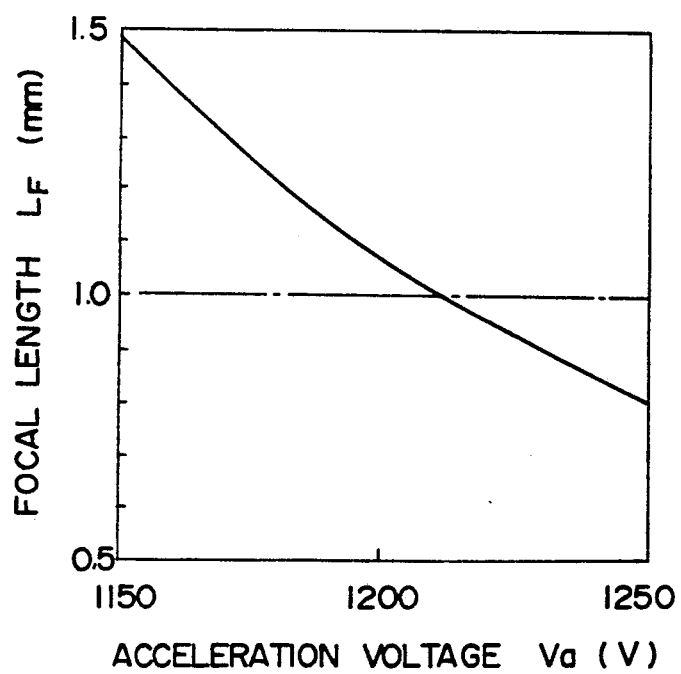

In this system, when the voltage ($V_a$) of the acceleration power source 208 is set at 1.2 kV, FIG. 4 shows how the focal length of the electron beam is altered by changing the voltage of the power source 207. Note that in FIG. 4, the focal length of electron beam with the position of the electron source 201 as the origin is $L_F$, and the voltage of the power source 207 is $V_M$. In an experimental system, when $V_M=21.6V$ ($V_a/V_M=55.6$), the electron beam having a diameter of 1 μm emitted from the electron source 201 was observed as a converged beam having a diameter of less than 0.7 μm on the target plane 204 where $D/(d+1)<V_a/V_{M,\alpha}=0.39$. Also, FIG. 5 shows how the focal length of electron beam is altered with the voltage of the acceleration power source 208 when the voltage of the power source 207 is set at 22V. Note that in FIG. 5, $V_a$ indicates the voltage of the acceleration power source 208. In this case, when $V_a=1210V$ ($V_a/V_M=55$), the electron beam having a diameter of 1 μm emitted from the electron source 201 was observed as a converged beam having a diameter of less than 0.7 μm on the target plane 204 where $D/(d+t)<V_a/V_M$, $\alpha=0.375$.

As above described, according to the present invention, the converged beam can be obtained not with such a complex constitution as the electron beam apparatus shown in FIG. 1, but with a simple constitution.

Note that the electron source of this example was a GaAs Schottky type electron emission element having an electron emission portion of circular shape. The manufacturing method of the electron source portion will be described with reference to FIG. 6. The substrate of the electron source portion was one in which a Be doped p-type epitaxial layer 322 having carriers of $5\times10^{16}$ atoms/cm$^3$ was formed on a Zn doped p-type gallium arsenide substrate 321 having carriers of $8\times10^{18}$ atoms/cm$^3$ with the MBE growth (molecular beam epitaxy), as a raw material.

Figure 6A:
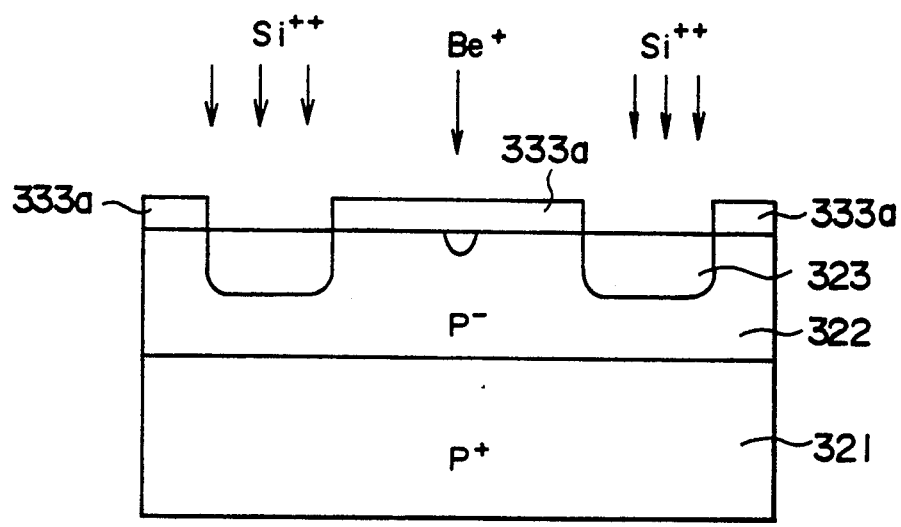
FIGS. 6A to 6D are view showing the manufacturing process of an electron source in the electron beam apparatus of the present invention.

After a silicon nitride film 333a is coated 2000 Å on this substrate, with the CDV method, as shown in FIG. 6A, the silicon nitride film 333a is appropriately patterned to form an n-type region, Si ions are injected at two different voltages of 160 keV and 80 keV using a focused ion beam apparatus so that the Si ion density can decrease gradually from the surface (the graded junction can be obtained), while at the same time Be ions are injected through the silicon nitride film 333a at 80 keV. By such injections as shown in FIG. 6B, the n-type region 323 was formed up to a depth of 5000 Å, while at the same time a high having a depth of 2000 Å and a diameter of 1 μmφ.

Figure 6B:
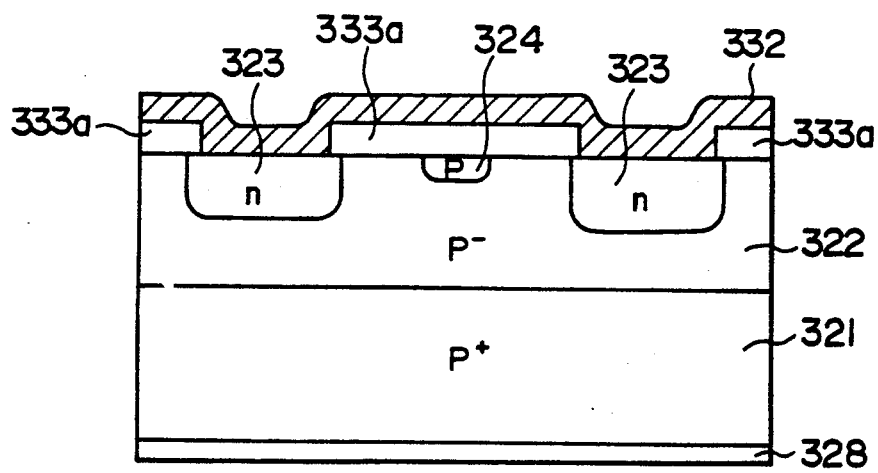

Next, after an ion implantation portion had been appropriately annealed as shown in FIG. 6B with the silicon nitride film 333 remained, Al was deposited from above the silicon nitride film as a contact electrode 332. With this method, an n-type layer forming portion was connected to the contact electrode 332 in the self alignment. And an ohmic electrode 328 was formed on a back side of the substrate.

Figure 6C:
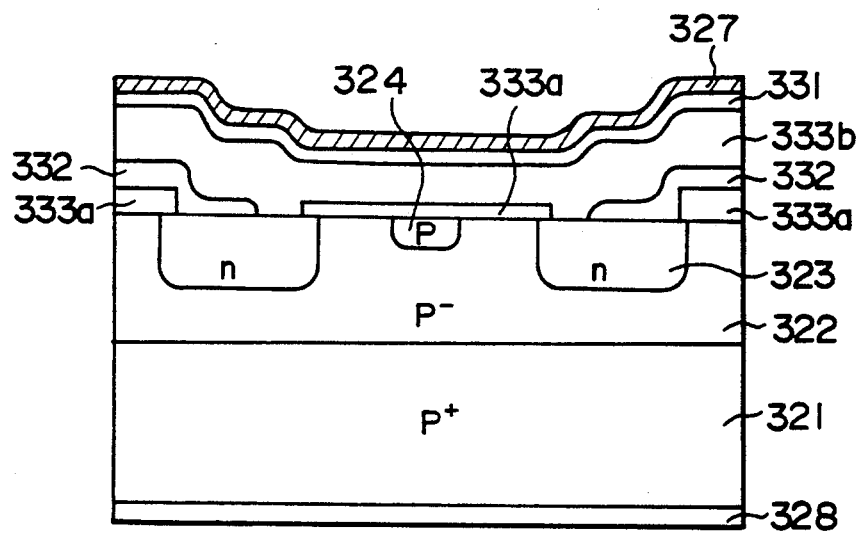

Furthermore, Al only on the high density p-type layer was removed with an appropriate mask using a phosphoric acid, as shown in FIG. 6C, a silicon dioxide 333b and a silicon nitride film 331 was deposited, and subsequently gold was vapor-deposited as an electrode 327. Then an aperture portion was formed on an upper portion of the electron source using a resist, that is, firstly, the gold of the contact electrode 327 was dissolved with a mixed etchant of potassium iodide and iodine, the silicon nitride film 331 was patterned with the CF$_4$ plasma etching, and then the silicon dioxide 333b was removed with the wet etching of hydrogen fluoride and ammonium fluoride. At this time, an excellent taper shape was formed on a lower portion of extraction electrode 327 by using the fact that the etch rates of silicon nitride and silicon dioxide with the wet etching are largely different.

Figure 6D:
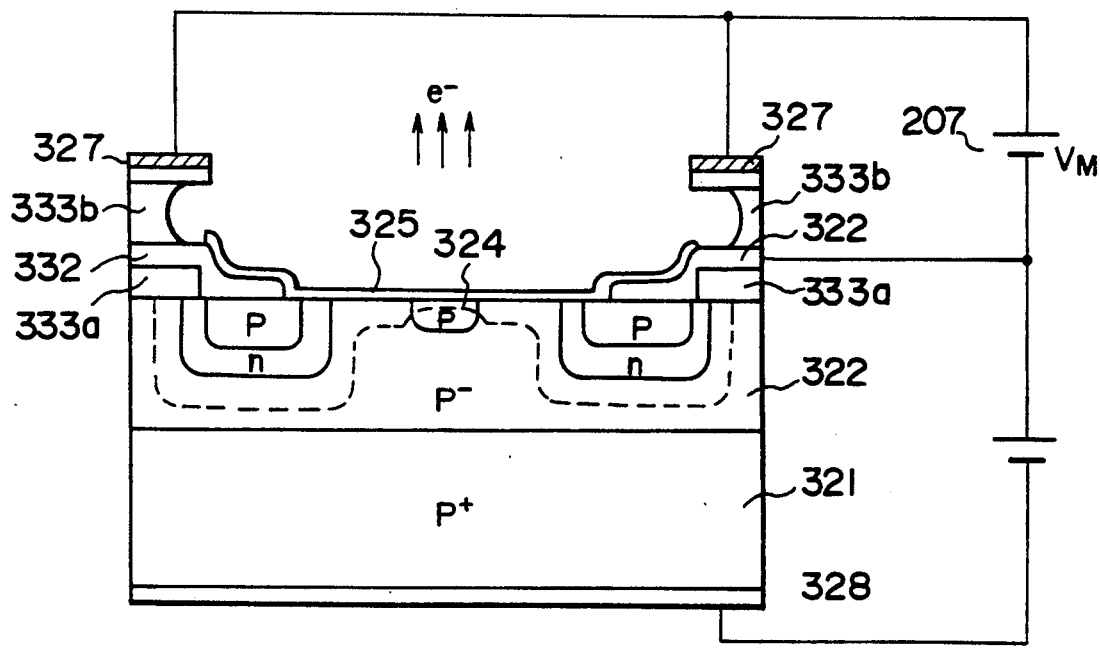

Furthermore, after the silicon nitride film on the high density p-type region was removed with the plasma etching of CF$_4$, a BaB$_6$ film 325 was deposited with the electron beam evaporation. BaB$_6$ was deposited to be connected to the contact electrode 332 with the aperture portion formed as a mask, and to form an excellent Schottky junction. Finally, BaB$_6$ in unnecessary portion was removed together with the resist so as to make the electron source and electrode of Schottky type as shown in FIG. 6D.

SECOND EXAMPLE

Figure 7:
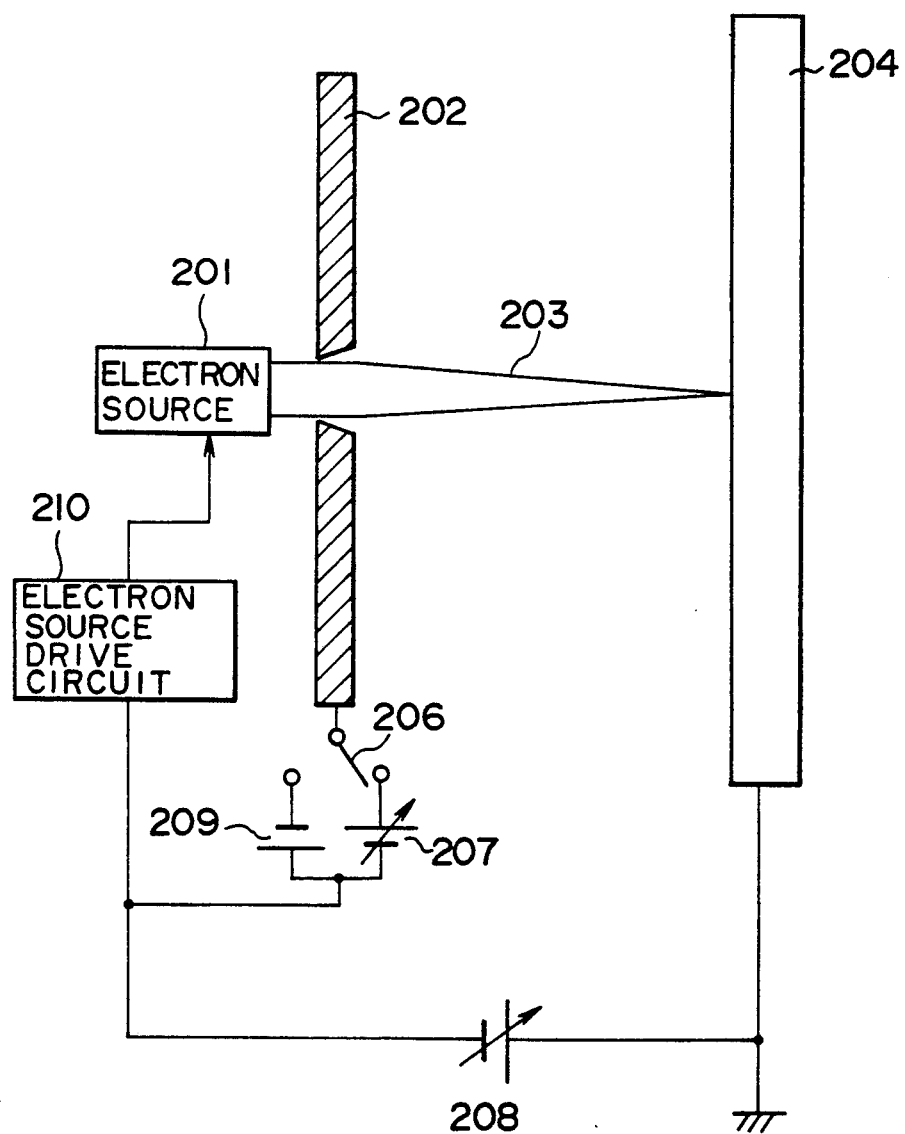

The second example of the present invention will be described with reference to FIG. 7. In FIG. 7, 206 is a switch for selecting whether the voltage applied to an electrode 202 is the voltage of power source 207 or power source 209, and 209 is a power source for applying a negative voltage relative to an electron source 201 to the electrode 202.

If the voltage of the power source 207 is applied to the electrode 202 with the switch 206, the electron beam is converged onto a target plane 204 as described in the first example, while if the voltage of the power source 209 is applied to the electrode 202, the electron beam will not reach the target plane 204.

With this example, the converged electron beam on the target plane 204 could be turned ON/OFF.

THIRD EXAMPLE

Figure 8A:
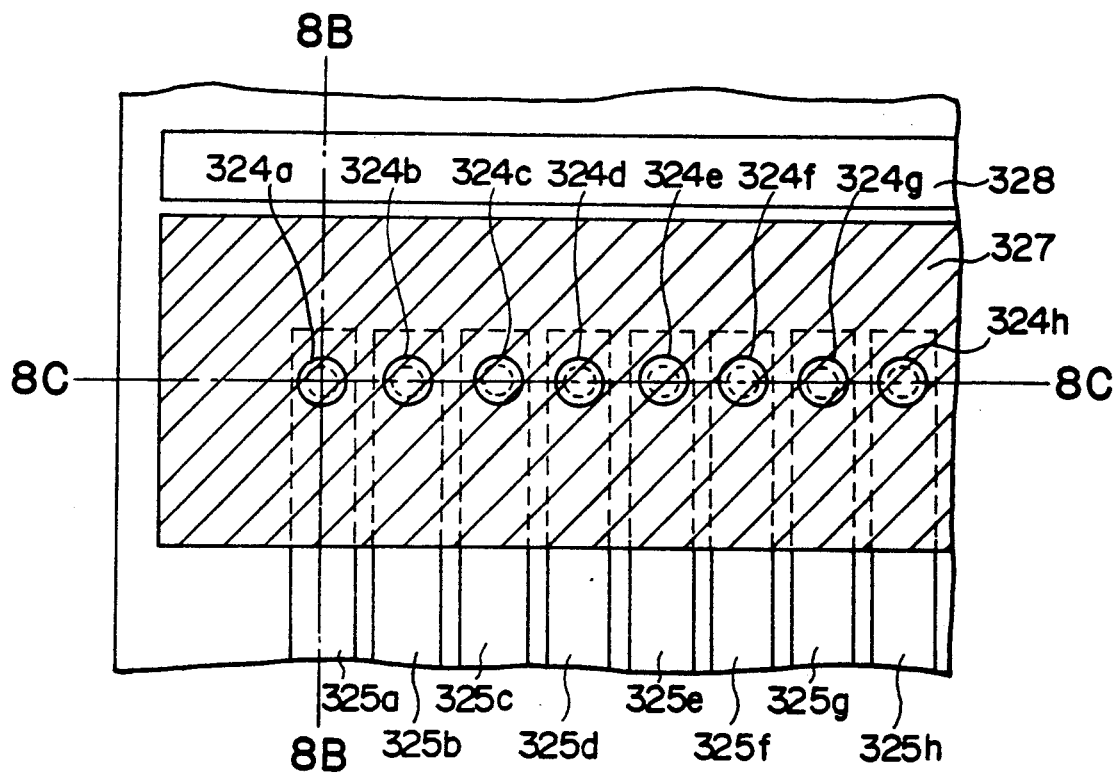
FIG. 8A is a partial plan view of the electron beam apparatus of the present invention.
Figure 8B:
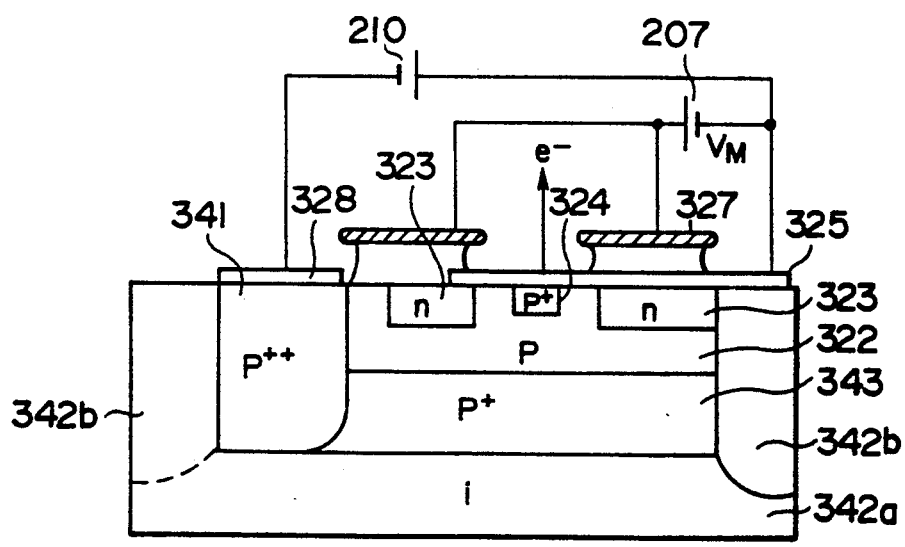
FIGS. 8B and 8C are a B—B cross-sectional view and a C—C cross-sectional view, respectively.
Figure 8C:
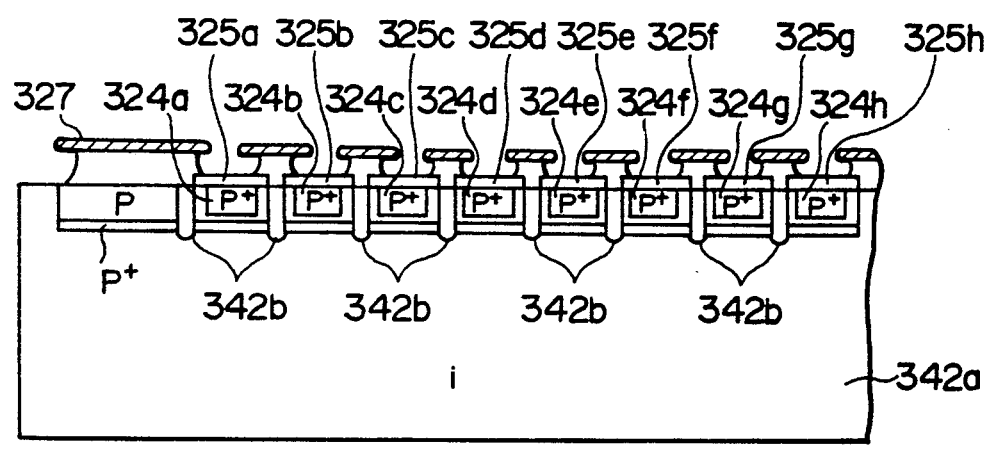

The third example of the present invention will be described with reference to FIG. 8. In the third example, a plurality of units each consisting of a Schottky-type electron emission element and an electrode formed on a semi-insulating substrate, are disposed opposed to a target plane on a stage, not shown. FIG. 8A is a partial plan view, and FIGS. 8B and 8C are a B—B cross-sectional view and a C—C cross-sectional view. In these figures, 343a is a GaAs substrate, 342b is an element isolation region, 322, 341 and 343 are p-type regions, 323 is an n-type region, 324 is a high density p-type region, 325 is a Schottky electrode, 327 is an electrode, 328 is an ohmic electrode, and 207 is a power source for electrode. 210 is a power source for driving electron source.

Note that in FIGS. 8A and 8C, the high density p-type region 324 and the Schottky electrode 325 are indicated with 324a to 324h and 325a to 325h, respectively, for a plurality of units.

Next, the manufacturing method of electron emission element and electrode portion will be described with reference to FIG. 8.

As shown in FIG. 8, a p+ layer 343 of Al0.5Ga0.5As was epitaxially grown while Be was doped $10^{18}$ (cm$^{-3}$) on a semi-insulative substrate 342a of GaAs (100), and then a p layer 322 of Al0.5Ga0.5As was epitaxially grown while Be was doped $10^{16}$ (cm$^{-3}$).

Next, Be was implanted into a deep layer at about 180 keV with the FIB (focused ion beam) so that the impurity density of p++ layer 341 might be $10^{19}$ (cm$^{-3}$), and Be was implanted into a relatively thin layer at about 40 keV so that the impurity density of p+ layer 324 might be $5 \times 10^{17}$ (cm$^{-3}$). Furthermore, Si was implanted at about 60 keV so that the impurity density of n layer 323 might be $10^{18}$ (cm$^{-3}$). Also, proton or boron ions were implanted at an acceleration voltage of 200 keV or more to form an element isolation region 342b.

Next, the annealing was performed in an air flow of arsine+N$_2$+H$_2$ at 800° C. and for 30 minutes, BaB$_6$ ($\phi_{wk}=3.4eV$) was deposited about 100 Å after an appropriate masking had been made, and a Schottky electrode 325 was formed by annealing at a temperature of 600° C. and for 30 minutes. As in the first example shown in FIG. 6, the electrode 327 was formed, and finally, the surface oxidation process was performed to oxidize one-third the surface of BaB$_6$ and form BaO ($\phi_{wk}=1.8eV$).

With the constitution of this example, the pattern exposure with the electron beam was enabled.

Furthermore, in this example, the electrode 327 was made common to each electron source, but could be driven independently for each electron source with the patterning.

While in the above example, the aperture shape was made circular as a preferred example, it is noted that the aperture shape is not limited to a circular shape, but can be made a desired shape such as ellipse or polygon.

EFFECTS OF THE INVENTION

As above described, there are following effects with the present invention.

(1) the apparatus is at a low price with a simple constitution.

(2) the apparatus is light with the simple constitution.

(3) the spacial volume occupied by the apparatus is small with the simple constitution. Particularly, the apparatus is low in height, with only smaller number of racks storing control and power supply equipments.

(4) there are fewer adjustment portions with the simple constitution, so that the adjustment for the performance of apparatus is simple.

(5) there are smaller number of components with the simple constitution, so that the reliability is increased.

(6) the converged beam can be obtained on the target plane regardless of the simple constitution.

Particularly, there is an excellent effect that owing to the formation on a minute area with the semiconductor process technique, the electron beams obtained can be sufficiently converged to the order of submicron on the target plane, by using a semiconductor electron source superior in the parallelism, with a simple constitution of a combination with one electrode having an aperture.

What is claimed is:

1. An electron beam apparatus for applying an electron beam from an electron source onto a target plane, comprising: one sheet of electrode disposed between said electron source for emitting electrons in the electron beam in parallel or substantially in parallel and a target arrangement position, and a power source for supplying a desired voltage to said electrode, wherein said target arrangement position is set so that the distance between said electron source and said electrode is in a range from 500 Å to 50 µm, and the distance between said electrode and said target lane is in a range from 500 µm to 100 µm.

2. The electron beam apparatus according to claim 1, characterized in that the electron source is the type of emitting electrons by applying a reverse bias voltage to a PN junction to cause the avalanche breakdown phenomenon.

3. The electron beam apparatus according to claim 1, characterized in that the electron source is the type of emitting electrons by applying a reverse bias voltage to a Schottky barrier junction to cause the avalanche breakdown phenomenon.

4. The electron beam apparatus according to claim 1, characterized in that the electron source is the MIM type.

5. The electron beam apparatus according to claim 1, characterized in that the electron source is the type of emitting electrons by using the NEA state.

6. The electron beam apparatus according to claim 1, wherein the divergence angle of the electron beam from said electron source emitting the electrons n the electron beam in parallel or substantially in parallel is within an angle of 15°.

7. An electron beam apparatus for applying an electron beam from an electron source onto a target plane, comprising: a plurality of units, each of which comprises one sheet of electrode disposed between said electron source for emitting electrons in the electron beam in parallel or substantially in parallel and a target arrangement position, and a power source for supplying a desired voltage to said electrode, wherein said target arrangement position is set so that the distance between said electron source and said electrode is in a range from 500 Å to 50 µm, and the distance between said electrode and said target lane is in a range from 500 µm to 100 mm.

8. The electron beam apparatus according to claim 7, characterized in that the electron source is the type of emitting electrons by applying a reverse bias voltage to a PN junction to cause the avalanche breakdown phenomenon.

9. The electron beam apparatus according to claim 7, characterized in that the electron source is the type of emitting electrons by applying a reverse bias voltage to a Schottky barrier junction to cause the avalanche breakdown phenomenon.

10. The electron beam apparatus according to claim 7, characterized in that the electron source is the MIM type.

11. The electron beam apparatus according to claim 7, characterized in that the electron source is the type of emitting electrons by using the NEA state.

12. The electron beam apparatus according to claim 7, wherein the divergence angle of the electron beam from said electron source emitting the electrons in the electron beam in parallel or substantially parallel is within an angle of 15°.

13. An electron beam apparatus according to claim 7, wherein said units have a common power supply.

14. A driving method for an electron beam apparatus for applying an electron beam from an electron source onto a target plane, the apparatus comprising one sheet of electrode disposed between said electron source emitting electrons in the electron beam in parallel or substantially in parallel and a target arrangement position, and a power source for supplying a desired voltage to said electrode, characterized in that assuming that the distance from said electron source to said electrode is d, the thickness of said electrode is t, the distance from said electrode to said target plane is D, the potential of said electrode with respect to said electron source is $V_M$, the potential of said target plane with respect to said electron source is $V_a$, in a state where the electron beam is applied onto the target plane, a condition:

$$D/(d+t) < V_a/V_M$$

is met.

15. A driving method for an electron beam apparatus, comprising a plurality of units, each of which comprises of one sheet of electrode disposed between an electron source emitting electrons of an electron beam in parallel or substantially in parallel and a target arrangement position, and a power source for supplying a desired voltage to said electrode, characterized in that assuming that in each unit, the distance from said electron source to said electrode is di [μm], the thickness of said electrode is ti, the distance from said electron source to a target plane is Di (i=1, 2, ..., the number of units), and the potential of said target plane with respect to said electron source is $V_a$, the condition $$V_{Mi} < (di+ti/Di) \cdot V_a$$

is met for each electrode potential $V_{Mi}$ with respect to each electron source.

16. A driving method for an electron beam apparatus according to claim 15, wherein said units have a common power supply.

17. A driving method for an electron beam apparatus, comprising a plurality of units, each of which comprises one sheet of electrode disposed between an electron source emitting electrons of an electron beam in parallel or substantially in parallel and a target arrangement position, and a power source for supplying a desired voltage to said electrode, characterized in that assuming that, in each unit, the distance from said electron source to said electrode is di, the thickness of said electrode is ti, the distance from said electron source to a target plane is Di (i=1, 2, ..., the number of units), and the potential of said target plane with respect to said electron source is $V_a$, in a state where the electron beam is applied onto the target plane, the equation $$V_{Mi} = V_a \cdot (di+ti)/Di \cdot (1+\alpha) \quad (0 < \alpha < 1.0)$$

is met for each electrode potential $V_{Mi}$ to each electron source.

18. A driving method for an electron beam apparatus according to claim 17, wherein said units have a common power supply.

19. A driving method according to claim 14, wherein the relation of D/(d+t) and $V_a/V_M$ satisfies the following equation, $$D/(d+t) \cdot (1+\alpha) = V_a/V_M \quad (0 < \alpha < 1.0)$$

* * * * *

UNITED STATES PATENT AND TRADEMARK OFFICE
CERTIFICATE OF CORRECTION

PATENT NO. : 5,233,196

DATED : August 3, 1993

INVENTOR(S) : Masahiko Okunuki et al

It is certified that error appears in the above-indentified patent and that said Letters Patent is hereby corrected as shown below:

TITLE PAGE, ITEM [56] REFERENCES CITED:

```
U.S. Patent Documents, insert,
--4,259,678   3/1981   van Gorkom et al.
  4,303,930  12/1981   van Gorkom et al.
  4,825,082   4/1989   Okunuki et al.
  4,904,895   2/1990   Tsukamoto et al.
  4,956,578   9/1990   Shimizu et al.--.
```

COLUMN 1

Line 36, "U.S. Pat. No. 4259678)" should read
   --U.S. Pat. No. 4,259,678)--.
Line 37, "U.S. Pat. No. 4303930)," should read
   --U.S. Pat. No. 4,303,930),--.

COLUMN 2

Line 49, "particularly" should read --particularly to--.
Line 65, "lighter" should read --,--.

COLUMN 3

Line 13, "view" should read --views--.
Line 57, "breakdown,." should read --breakdown,--.
Line 59, "NA state." should read --NEA state.--.

UNITED STATES PATENT AND TRADEMARK OFFICE
CERTIFICATE OF CORRECTION

PATENT NO. : 5,233,196                                    Page 2 of 3
DATED     : August 3, 1993
INVENTOR(S) : Masahiko Okunuki et al It is certified that error appears in the above-indentified patent and that said Letters Patent is hereby corrected as shown below:

COLUMN 4

Line 4, "Va [V]," should read --$V_a$ [V],
Line 12, "t [μm]:" should read --t [μm],--.
Line 14, "VM [V]," should read --$V_M$ [V],--.
Line 16, "Va [V]," should read --$V_a$ [V],--.
Line 37, "$V_{mi}$<{(di+ti)Di}$V_a$" should read
        --$V_{mi}$<{(di+ti)/Di}$V_a$--.
Line 53, "$V_a$ V]," should read --$V_a$ [V],--.

COLUMN 5

Line 48, "source 208" should read --source 208.--.
Line 60, "$V_a$ V]," should read --$V_a$ [V],--.
Line 67, "{D/(D+t)}·(1+α)=$V_a$/$V_M$(0<α<1)" should read
        --{D/(d+t)}·(1+α)=$V_a$/$V_M$(0<α<1)--.

COLUMN 6

Line 22, "the d+t≦25" should read --the thickness t of
        the electrode should be preferably d+t≦25--.
Line 45, "of" should read --of the--.

COLUMN 7

Line 9, "($V_a$/$V_M$=55.6)," should read --($V_a$/$V_M$≅55.6),--.
Line 13, "$_a$.0.39." should read --$_a$=0.39.--.
Line 14, "of" should read --of the--.
Line 50, "high having" should read --high density p-type
        region 324 was obtained in a region having--.

UNITED STATES PATENT AND TRADEMARK OFFICE
CERTIFICATE OF CORRECTION

PATENT NO. : 5,233,196
DATED : August 3, 1993
INVENTOR(S) : Masahiko Okunuki et al It is certified that error appears in the above-indentified patent and that said Letters Patent is hereby corrected as shown below:

COLUMN 8

LIne 46, "343a" should read --342a--.

COLUMN 9

Line 64, "lane" should read --plane--.
Line 65, "100 µm." should read --100 mm.--.

COLUMN 10

Line 16, "n" should read --in--.
Line 30, "lane" should read --plane--.

COLUMN 11

Line 8, "of" (first occurrence) should be deleted.

Signed and Sealed this

Twenty-first Day of June, 1994

*Attest:*

BRUCE LEHMAN

*Attesting Officer*   *Commissioner of Patents and Trademarks*